US012586528B2

(12) United States Patent
Xiong

(10) Patent No.: US 12,586,528 B2
(45) Date of Patent: Mar. 24, 2026

(54) PIXEL DRIVING CIRCUIT, ARRAY SUBSTRATE AND DISPLAY DEVICE

(71) Applicant: Xiamen Tianma Display Technology Co., Ltd., Xiamen (CN)

(72) Inventor: Ke Xiong, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/944,880

(22) Filed: Nov. 12, 2024

(65) Prior Publication Data

US 2025/0069550 A1     Feb. 27, 2025

Related U.S. Application Data

(62) Division of application No. 18/109,262, filed on Feb. 14, 2023, now Pat. No. 12,183,284.

(30) Foreign Application Priority Data

Nov. 29, 2022     (CN) ......................... 202211507295.2

(51) Int. Cl.
*G09G 3/3233*     (2016.01)
*H10K 59/121*     (2023.01)
*H10K 59/131*     (2023.01)

(52) U.S. Cl.
CPC ....... *G09G 3/3233* (2013.01); *H10K 59/1213* (2023.02); *H10K 59/1216* (2023.02); *H10K 59/131* (2023.02); *G09G 2300/0819* (2013.01); *G09G 2300/0842* (2013.01); *G09G 2300/0861* (2013.01); *G09G 2310/08* (2013.01); *G09G 2320/0233* (2013.01)

(58) Field of Classification Search
CPC ................... G09G 3/3225; G09G 3/36; G09G 2310/0202; G09G 2320/0233; G09G 3/3258; G09G 3/3266; H01L 27/124; H01L 27/1255; H10K 59/1213; H10K 59/1216; H10K 59/131; H10K 59/1315
See application file for complete search history.

(56) References Cited

U.S. PATENT DOCUMENTS

2016/0232836 A1* 8/2016 Yang .................... G09G 3/3233
2020/0335035 A1 10/2020 Gai et al.
2021/0174741 A1* 6/2021 Jeong .................. G09G 3/3233
2021/0376026 A1* 12/2021 Mou .................... G09G 3/3233
2022/0367602 A1 11/2022 Li et al.
2023/0042966 A1 2/2023 Huangfu et al.

* cited by examiner

*Primary Examiner* — Nelson M Rosario
(74) *Attorney, Agent, or Firm* — Anova Law Group, PLLC

(57) ABSTRACT

An array substrate includes a first direct voltage signal line extending along a first direction; and a second direct voltage signal line extending along a second direction, the first direction intersecting the second direction. Pixel driving circuits are arranged in an array along the first direction and the second direction, and are respectively electrically connected to the first direct voltage signal line and the second direct voltage signal line. A pixel driving circuit includes a first transistor having a gate electrically connected to a first node. The first transistor is configured to provide a driving current for a light-emitting element. A first storage capacitor includes a first plate electrically connected to the first node, and a second plate electrically connected to a first electrode of the light-emitting element through a first connection part.

9 Claims, 10 Drawing Sheets

PIXEL DRIVING CIRCUIT, ARRAY SUBSTRATE AND DISPLAY DEVICE

CROSS-REFERENCE TO RELATED APPLICATION

This application is a divisional of U.S. patent application Ser. No. 18/109,262, filed on Feb. 14, 2023, which claims the priority of Chinese Patent Application No. 202211507295.2, filed on Nov. 29, 2022, the content of which is incorporated by reference in its entirety.

TECHNICAL FIELD

The present disclosure generally relates to the field of display technology and, more particularly, relates to a pixel driving circuit, an array substrate and a display device.

BACKGROUND

In current display panels, due to limitations of the crystallization process, thin film transistors (TFT) at different positions often have non-uniformity in electrical parameters such as threshold voltage and mobility. This non-uniformity will be converted into differences in the brightness and the chromaticity of sub-pixels in the display panel, and be perceived by human eyes, which is known as the Mura phenomenon.

SUMMARY

One aspect of the present disclosure provides a pixel driving circuit. The pixel driving circuit includes a driving circuit, configured to provide a driving current for a light-emitting element; a data writing circuit, where a control terminal of the data writing circuit is electrically connected to a first scan signal terminal, a first terminal of the data writing circuit is electrically connected to a data signal terminal, and a second terminal of the data writing circuit is electrically connected to a first terminal of the driving circuit; a threshold compensation circuit, where a control terminal of the threshold compensation circuit is electrically connected to a second scan signal terminal, a first terminal of the threshold compensation circuit is electrically connected to a control terminal of the driving circuit, and a second terminal of the threshold compensation circuit is electrically connected to a second terminal of the driving circuit; and a first storage circuit, where a first terminal of the first storage circuit is electrically connected to the control terminal of the driving circuit, and a second terminal of the first storage circuit is electrically connected to a first electrode of the light-emitting element. In a threshold compensation phase, the data writing circuit turns on in response to a turn-on level provided by the first scan signal terminal, and the threshold compensation circuit turns on in response to a turn-on level provided by the second scan signal terminal. In a light emission phase, the first storage circuit adjusts a potential of the control terminal of the driving circuit in response to a change in potential of the first electrode of the light-emitting element.

Another aspect of the present disclosure provides an array substrate. The array substrate includes a first direct voltage signal line extending along a first direction and a second direct voltage signal line extending along a second direction, where the first direction intersects the second direction; a plurality of pixel driving circuits, where the pixel driving circuits are arranged in an array along the first direction and the second direction, and the pixel driving circuits are respectively electrically connected to the first direct voltage signal line and the second direct voltage signal line. A pixel driving circuit includes a first transistor, where a gate of the first transistor is electrically connected to a first node, and the first transistor is configured to provide a driving current for the light-emitting element; a first storage capacitor, where a first plate of the first storage capacitor is electrically connected to the first node, and a second plate of the first storage capacitor is electrically connected to a first electrode of the light-emitting element through a first connection part.

Another aspect of the present disclosure provides a display device. The display device includes a pixel driving circuit or an array substrate provided by the disclosed embodiments of the present disclosure.

BRIEF DESCRIPTION OF THE DRAWINGS

In order to illustrate the technical solutions of the embodiments of the present disclosure more clearly, the accompanying drawings used in the embodiments of the present disclosure shall be briefly introduced below. It should be obvious to those skilled in the art that, other drawings may also be obtained based on these drawings without creative effort.

DETAILED DESCRIPTION

Figures 1, 2:
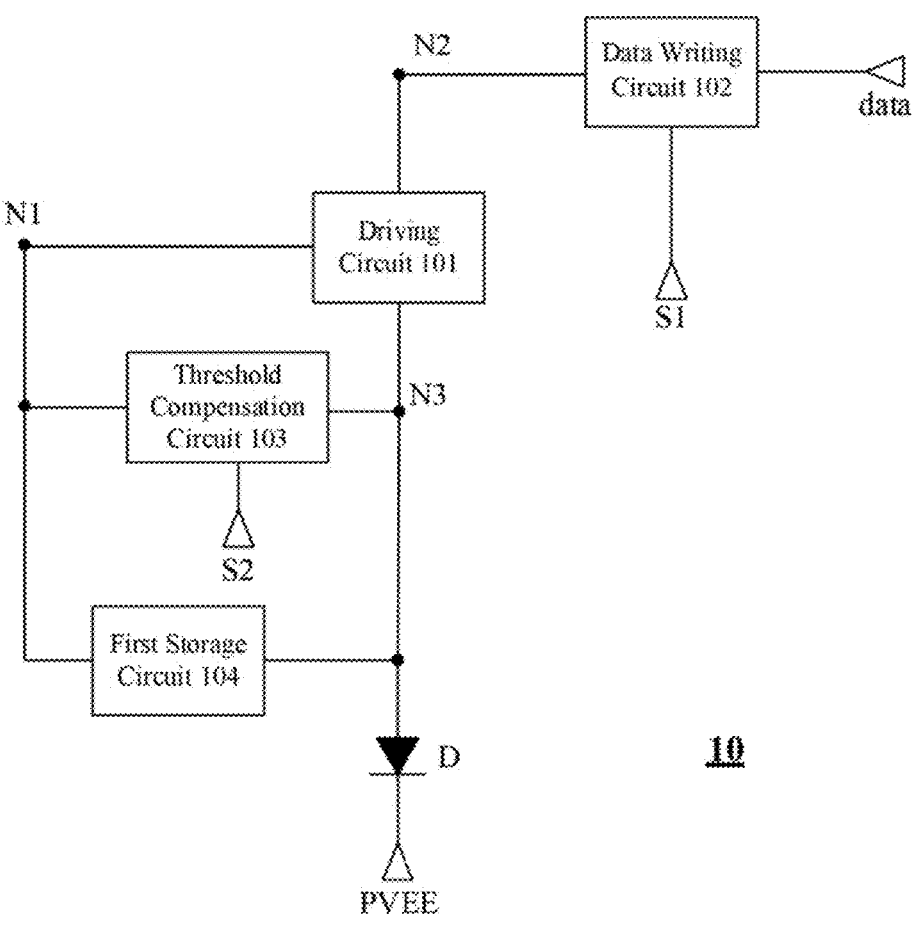
FIG. 1 illustrates a schematic circuit diagram of a pixel driving circuit according to various embodiments of the present disclosure.
FIG. 2 illustrates a schematic diagram of a driving sequence corresponding to the pixel driving circuit illustrated in FIG. 1.

The features and exemplary embodiments of various aspects of the present disclosure will be described in detail below. The present disclosure is further detailed below in conjunction with the accompanying drawings and specific embodiments in order to provide a clearer understanding of the objects, technical solutions and advantages of the present disclosure. It should be understood that the specific embodiments described herein are only used to explain the present disclosure and not to limit the present disclosure. However, it is apparent to those skilled in the art that the present disclosure may be implemented without some of these specific details. The following description of the embodiments is only to provide a better understanding of the present disclosure by showing embodiments of the present disclosure.

It should be noted that in this disclosure, relational terms, such as first and second, are only used to distinguish one entity or operation from another entity or operation, and do not necessarily require or imply one of these entities or operations to have any such actual relationship or order therebetween. Moreover, the terms "include", "containing" or any other variants thereof are intended to cover non-exclusive inclusion, such that a process, method, article or device including a series of elements not only includes those elements, but also includes those that are not explicitly listed, or also includes elements inherent to this process, method, article or device. If there are no more restrictions, the elements defined by the sentence "including . . . " do not exclude the existence of other identical elements in the process, method, article, or device that includes the elements.

The term "and/or" used in this disclosure is only an association relationship describing associated objects, indicating that there may be three types of relationships. For example, A and/or B may mean that A alone exists, and both A and B exist at the same time and B exists alone. In addition, the character "/" in this text generally indicates that the associated objects before and after are in an "or" relationship.

The transistors in the embodiments of the present disclosure are described by using N-type transistors as an example, but they are not limited to N-type transistors and may also be replaced with P-type transistors. For N-type transistors, the turn-on level is a high level and the cut-off level is a low level. That is, when the gate of the N-type transistor is at a high level, the N-type transistor is turned on between its first electrode and second electrode, and when the gate of the N-type transistor is at a low level, the N-type transistor is turned off between its first electrode and second electrode. For P-type transistors, the turn-on level is a low level and the cut-off level is a high level. That is, when the gate of the P-type transistor is at a low level, the P-type transistor is turned on between its first electrode and second electrode, and when the gate of the P-type transistor is at a high level, the P-type transistor is turned off between its first electrode and second electrode. In some embodiments, the gates of the transistors mentioned above are used as their control electrodes. According to the signals of the gates of each transistor and their types, the first electrode may be used as a source and the second electrode may be used as a drain, or the first electrode may be used as a drain and the second electrode may be used as a source, either of which is considered in the present disclosure. In addition, the turn-on level and cut-off level in the embodiments of the present disclosure are for reference only. The turn-on level may refer to any level that may turn on a transistor and the cut-off level may refer to any level that may cut off/turn off a transistor.

In the embodiments of the present disclosure, the term "electrical connection" may refer to the direct electrical connection of two components or may refer to the electrical connection between the two components via one or more other components.

In the embodiments of the present disclosure, a first node, a second node, a third node, a fourth node and a fifth node are only defined for the convenience of describing circuit structure. The first node, the second node, the third node, the fourth node and the fifth node are not necessarily actual circuit units.

It is obvious to those skilled in the art that various modifications and variations can be made in this disclosure without departing from the spirit or scope of this disclosure. Therefore, this disclosure intends to cover the modifications and variations of the disclosure that fall within the scope of the corresponding claims (or claimed technical solutions) and their equivalents. It should be noted that the implementation manners provided by the embodiments of the present disclosure can be combined with each other if there is no contradiction.

Before describing the technical solutions provided by the embodiments of the present disclosure, to facilitate the understanding of the embodiments of the present disclosure, the present disclosure first specifically explains the problems existing in the related technologies.

In current display panels, due to limitations of the crystallization process, thin film transistors (TFT) at different positions often have non-uniformity in electrical parameters such as threshold voltage and mobility. This non-uniformity will be converted into differences in the brightness and the chromaticity of sub-pixels in the display panel, and be perceived by human eyes, which is known as the Mura phenomenon.

In order to solve the technical problem mentioned above, the embodiments of the present disclosure provide a pixel driving circuit, an array substrate and a display device.

The technical concept of the embodiments of the present disclosure is to compensate the threshold voltage of a driving circuit in the threshold compensation phase. Moreover, in the light emission phase, the potential of the control terminal of the driving circuit is adjusted by a first storage circuit in response to the change in potential of the first electrode of a light-emitting element. Since in the light emission phase, the second terminal of the driving circuit is connected to the first electrode of the light-emitting element, the adjustment of the first storage circuit may make a change pattern of the potential of the control terminal of the driving circuit consistent with a change pattern of the potential of the second terminal of the driving circuit. The threshold voltage may be kept within the voltage difference between the potential of the control terminal of the driving circuit and the potential of the second terminal of the driving circuit, thereby eliminating the influence of the threshold voltage on the driving current, thereby ameliorating the Mura phenomenon of the display panel and improving display uniformity.

First, a pixel driving circuit provided by various embodiments of the present disclosure is described hereinafter.

FIG. 1 illustrates a schematic circuit diagram of a pixel driving circuit according to various embodiments of the present disclosure. As illustrated in FIG. 1, a pixel driving circuit 10 provided by various embodiments of the present disclosure may include a driving circuit 101, a data writing circuit 102, a threshold compensation circuit 103 and a first storage circuit 104. The driving circuit 101 is configured to provide a driving current for a light-emitting element D. Exemplarily, the light-emitting element D includes but is not limited to an organic light-emitting diode (OLED).

The data writing circuit 102 is electrically connected to a first scan signal terminal S1, a first terminal of the data writing circuit 102 is electrically connected to a data signal terminal data, and a second terminal of the data writing circuit 102 is electrically connected to a first terminal of the driving circuit 101. A control terminal of the threshold compensation circuit 103 is electrically connected to a second scan signal terminal S2, a first terminal of the threshold compensation circuit 103 is electrically connected to a control terminal of the driving circuit 101, and a second terminal of the threshold compensation circuit 103 is electrically connected to a second terminal of the driving circuit 101. In some embodiments, the driving circuit 101 may include a thin film transistor, the control terminal of the driving circuit 101 may specifically be a gate of the thin film transistor, the first terminal of the driving circuit 101 may specifically be a drain of the thin film transistor, and the second terminal of the driving circuit 101 may specifically be a source of the thin film transistor. In some embodiments, the first terminal of the driving circuit 101 may be a source of the thin film transistor, and the second terminal of the driving circuit 101 may be a drain of the thin film transistor, which is not limited by the present disclosure.

The first storage circuit 104 is electrically connected to the control terminal of the driving circuit 101, and a second terminal of the first storage circuit 104 is electrically connected to a first electrode of the light-emitting element D. Exemplarily, the first electrode of the light-emitting element D may be an anode of the light-emitting element D.

FIG. 2 illustrates a schematic diagram of a driving sequence corresponding to the pixel driving circuit illustrated in FIG. 1. With reference to FIG. 1 and FIG. 2, within one frame time, a driving process of the pixel driving circuit 10 includes at least a threshold compensation phase t2 and a light emission phase t3. In the threshold compensation phase t2, the data writing circuit 102 turns on in response to the turn-on level provided by the first scan signal terminal S1 and writes the data signal output from the data signal terminal data into the first terminal of the driving circuit 101. The threshold compensation circuit 103 turns on in response to the turn-on level provided by the second scan signal terminal S2 and connects the control terminal of the driving circuit 101 and the second terminal of the driving circuit 101. The data signal is transmitted to the control terminal of the driving circuit 101 through the turned-on threshold compensation circuit 103 to complete the compensation of a threshold voltage Vth of the driving circuit 101. The first storage circuit 104 may maintain the potential of the control terminal of the driving circuit 101.

In the light emission phase t3, the first storage circuit 104 adjusts the potential of the control terminal of the driving circuit 101 in response to the change in potential of the first electrode of the light-emitting element D, so that a change pattern of the potential of the first electrode of the light-emitting element D is consistent with a change pattern of the potential of the control terminal of the driving circuit 101. In the light emission phase t3, the second terminal of the driving circuit 101 is connected to the first electrode of the light-emitting element D, and thus the adjustment of the first storage circuit 104 may make the change pattern of the potential of the control terminal of the driving circuit 101 consistent with the change pattern of the potential of the second terminal of the driving circuit 101. The threshold voltage Vth may be kept within the voltage difference between the potential of the control terminal of the driving circuit 101 and the potential of the second terminal of the driving circuit 101, thereby eliminating the influence of the threshold Vth voltage on the driving current. This then ameliorates the Mura phenomenon of the display panel and improves display uniformity.

Figure 3:
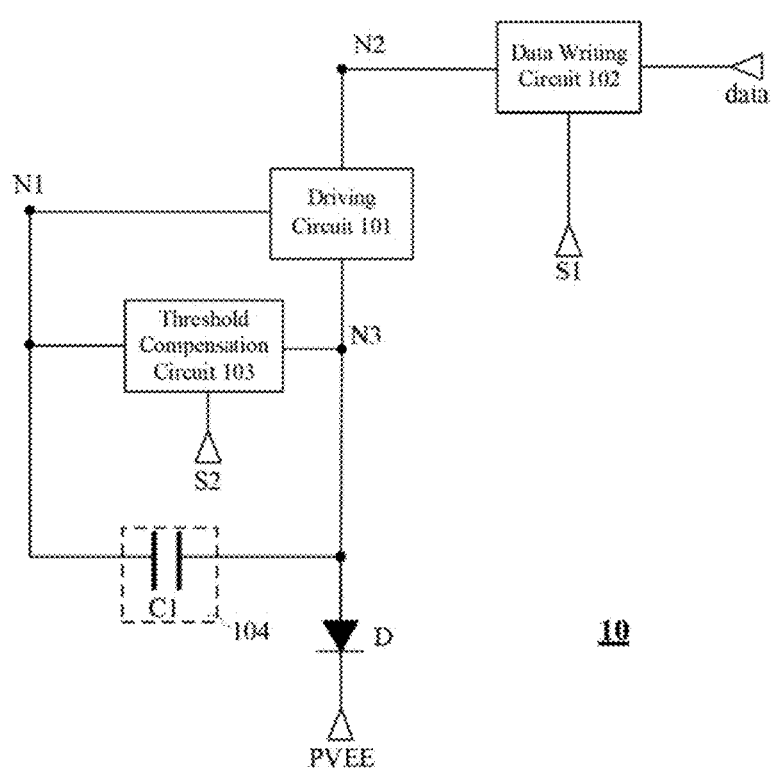
FIG. 3 illustrates another schematic circuit diagram of a pixel driving circuit according to various embodiments of the present disclosure.

FIG. 3 illustrates another schematic circuit diagram of a pixel driving circuit according to various embodiments of the present disclosure. As illustrated in FIG. 3, according to some embodiments of the present disclosure, optionally, a first storage circuit 104 may include a first storage capacitor C1. A first plate of the first storage capacitor C1 may be electrically connected to a control terminal of a driving circuit 101, and a second plate of the first storage capacitor C1 may be electrically connected to a first electrode of a light-emitting element D. It may be understood that, in addition to the function of storing charges, the first storage capacitor C1 also has a coupling function. In a light emission phase t3, the first storage capacitor C1 may, through its own coupling, adjust a potential of the control terminal of the driving circuit 101 in response to a change in potential of the first electrode of the light-emitting element D, so that the change pattern of the potential of the first electrode of the light-emitting element D is consistent with the change pattern of the potential of the control terminal of the driving circuit 101.

Accordingly, by using the first storage capacitor C1 as the first storage circuit 104, in one aspect, the potential of the control terminal of the driving circuit 101 may be maintained by utilizing the function of the capacitor to store charges. In another aspect, the coupling effect of the capacitor may be configured to adjust the potential of the control terminal of the driving circuit 101 during the light emission phase, so that the change pattern of the potential of the control terminal of the driving circuit 101 may be consistent with the change pattern of a potential of a second terminal of the driving circuit 101. Therefore, a threshold voltage Vth may be kept within the voltage difference between the potential of the control terminal of the driving circuit 101 and the potential of the second terminal of the driving circuit 101, thereby eliminating the influence of the threshold voltage Vth on a driving current of the pixel driving circuit 10. This then ameliorates the Mura phenomenon of the display panel and improves display uniformity.

Figure 4:
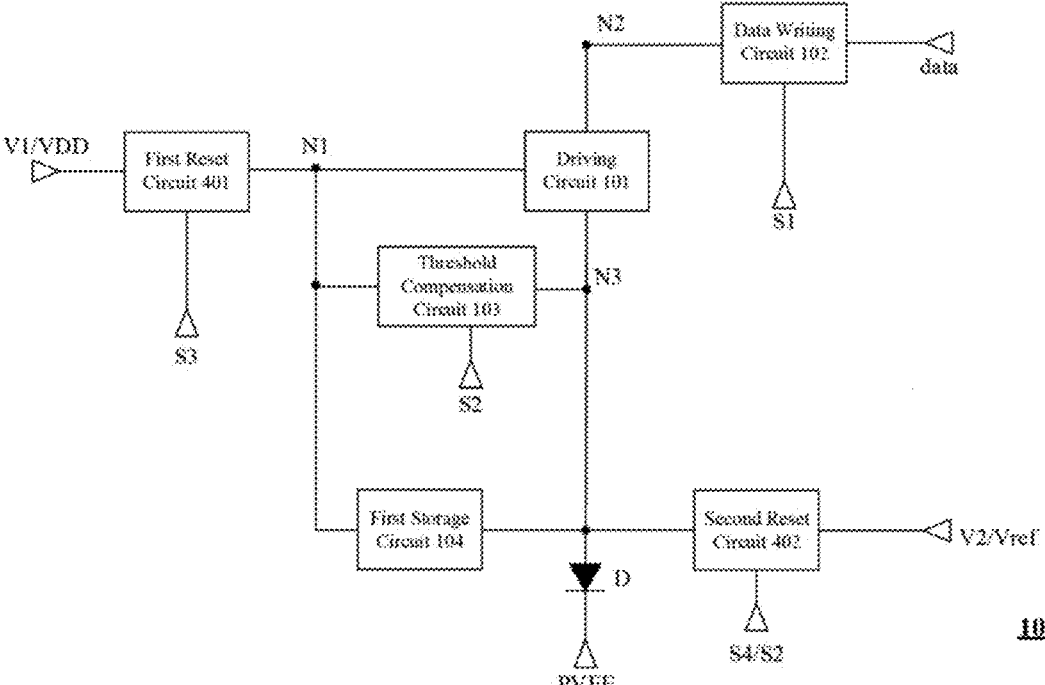
FIG. 4 illustrates another schematic circuit diagram of a pixel driving circuit according to various embodiments of the present disclosure.

FIG. 4 illustrates another schematic circuit diagram of a pixel driving circuit according to various embodiments of the present disclosure. As illustrated in FIG. 4, according to some embodiments of the present disclosure, optionally, the pixel driving circuit 10 may further include a first reset circuit 401. A control terminal of the first reset circuit 401 may be electrically connected to a third scan signal terminal S3, a first terminal of the first reset circuit 401 may be electrically connected to a first initialization signal terminal V1, and a second terminal of the first reset circuit 401 may be electrically connected to the control terminal of the driving circuit 101.

Figure 5:
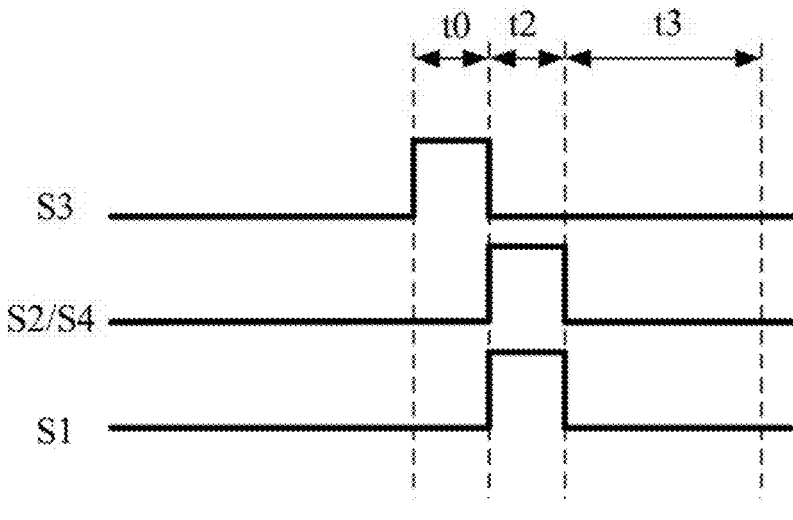
FIG. 5 illustrates a schematic diagram of a driving sequence corresponding to the pixel driving circuit illustrated in FIG. 4.

FIG. 5 illustrates a schematic diagram of a driving sequence corresponding to the pixel driving circuit illustrated in FIG. 4. With reference to FIG. 4 and FIG. 5, before a threshold compensation phase t2, a driving process of the pixel driving circuit 10 may further include a first initialization phase t0. In the first initialization phase t0, the first reset circuit 401 may turn on in response to the turn-on level provided by the third scan signal terminal S3 and transmit a first initialization signal of the first initialization signal terminal V1 to the control terminal of the driving circuit 101 to reset the control terminal of the driving circuit 101. In some embodiments, the driving circuit 101 may be an N-type thin film transistor, and the first initialization signal terminal V1 may specifically be a first direct voltage signal terminal (alternatively referred to as a first direct voltage signal line) VDD. The first direct voltage signal terminal VDD may provide a first initialization signal with a direct voltage value, so that the first initialization signal with the direct voltage value is configured to reset the control terminal of the driving circuit 101.

Accordingly, adding the first reset circuit 401 to reset the control terminal of the driving circuit 101 may ensure that subsequent data signals may be successfully written into the control terminal of the driving circuit 101, thereby ensuring the normal light emission of sub-pixels and the normal display of the display panel.

Figure 6:
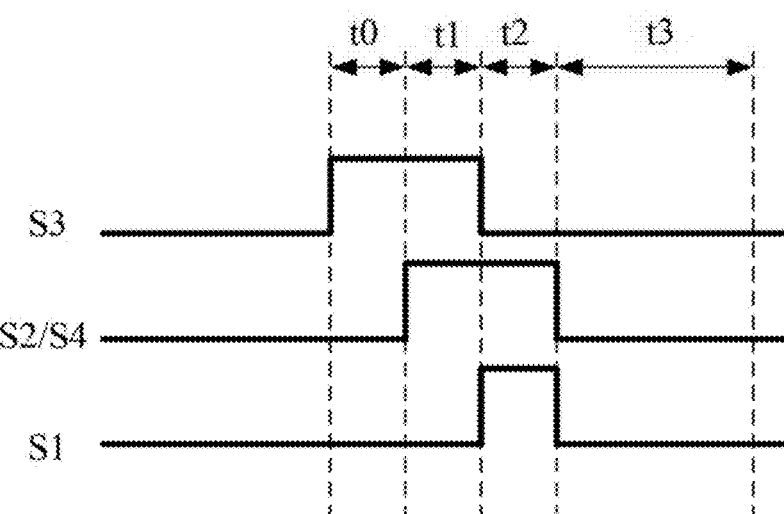
FIG. 6 illustrates a schematic diagram of another driving sequence corresponding to the pixel driving circuit illustrated in FIG. 4.

FIG. 6 illustrates a schematic diagram of another driving sequence corresponding to the pixel driving circuit illustrated in FIG. 4. With reference to FIG. 4 and FIG. 6, according to some embodiments of the present disclosure, optionally, a second initialization phase t1 may be further included between a first initialization phase t0 and a threshold compensation phase t2. In the second initialization phase t1, the first reset circuit 401 turns on in response to the turn-on level provided by the third scan signal terminal S3 and transmits a first initialization signal of the first initialization signal terminal V1 to the control terminal of the driving circuit 101 to reset the control terminal of the driving circuit 101.

Accordingly, in the embodiment illustrated in FIG. 6, the control terminal of the driving circuit 101 is not only reset in the first initialization phase t0, but also reset in the second initialization phase t1. In this way, the duration for resetting the control terminal of the driving circuit 101 is increased, ensuring that the control terminal of the driving circuit 101 is successfully reset, thereby ensuring that subsequent data signals are successfully written into the control terminal of the driving circuit 101 and thus the normal display of the display panel.

Refer continuously to FIG. 4, according to some embodiments of the present disclosure, optionally, the pixel driving circuit 10 may also include a second reset circuit 402. A control terminal of the second reset circuit 402 is electrically connected to a fourth scan signal terminal S4, a first terminal of the second reset circuit 402 is electrically connected to a second initialization signal terminal V2, and a second terminal of the second reset circuit 402 is electrically connected to the first electrode of the light-emitting element D.

With reference to FIG. 4 and FIG. 6, according to some embodiments of the present disclosure, optionally, in the second initialization phase t1, the second reset circuit 402 may turn on in response to a turn-on level provided by the fourth scan signal terminal S4, and transmit a second initialization signal of the second initialization signal terminal V2 to the first electrode of the light-emitting element D to reset the first electrode of the light-emitting element D. In some embodiments, the fourth scan signal terminal S4 may specifically be a reference voltage signal terminal Vref. The reference voltage signal terminal Vref may be configured to provide a second initialization signal with a negative voltage value, and the first electrode of the light-emitting element D is reset by the second initialization signal with the negative voltage value.

Accordingly, before the light emission phase, by adding the second reset circuit 402 to reset the first electrode of the light-emitting element D, the residual charge at the first electrode of the light-emitting element D may be released, effectively ameliorating the Mura phenomenon.

Further refer to FIG. 4 and FIG. 6, according to some embodiments of the present disclosure, optionally, in the threshold compensation phase t2, the second reset circuit 402 may turn on in response to the turn-on level provided by the fourth scan signal terminal S4 to continuously reset the first electrode of the light-emitting element D through the second initialization signal.

Accordingly, in one aspect, by continuously resetting the first electrode of the light-emitting element D in the second initialization phase t1 and in the threshold compensation phase t2, it may facilitate releasing the residual charge of the first electrode of the light-emitting element D as much as possible to better ameliorate the Mura phenomenon. In another aspect, resetting the first electrode of the light-emitting element D in advance in the second initialization stage t1 may effectively prevent the potential of the first electrode of the light-emitting element D from jumping to the low level when the data signal is written and influencing the potential of the control terminal of the driving circuit 101. This ensures that the control terminal of the driving circuit 101 can reach its target voltage value, for example, reach Vdata+Vth, where Vdata represents a voltage value of the data signal, and Vth represents the threshold voltage of the driving circuit 101.

Refer continuously to FIG. 4, according to some embodiments of the present disclosure, optionally, the fourth scan signal terminal S4 may be multiplexed with the second scan signal terminal S2. That is, the second reset circuit 402 and the threshold compensation circuit 103 may be turned on or turned off at the same time.

In this way, since the fourth scan signal terminal S4 multiplexes the second scan signal terminal S2, the number of signal terminals/lines and shift registers in the display panel may be decreased, wiring space may be saved, and production cost may be decreased.

Refer continuously to FIG. 4 and FIG. 6, according to some embodiments of the present disclosure, optionally, in the second initialization stage t1, the threshold compensation circuit 103 may turn on in response to the turn-on level provided by the second scan signal terminal S2. The first initialization signal provided by the first initialization signal terminal V1 may be transmitted to the second terminal of the driving circuit 101 through the threshold compensation circuit 103, to reset the second terminal of the driving circuit 101.

Accordingly, before the data signal is written, by resetting the second terminal of the driving circuit 101, the potential of the second terminal of the driving circuit 101 may be consistent with the potential of the control terminal of the driving circuit 101. Therefore, when subsequent data signals are written, the threshold voltage Vth may be successfully stored in the voltage difference between the potential of the control terminal of the driving circuit 101 and the potential of the second terminal of the driving circuit 101.

For ease of understanding, the pixel driving circuit 10 is described further with reference to some specific embodiments.

Figure 7:
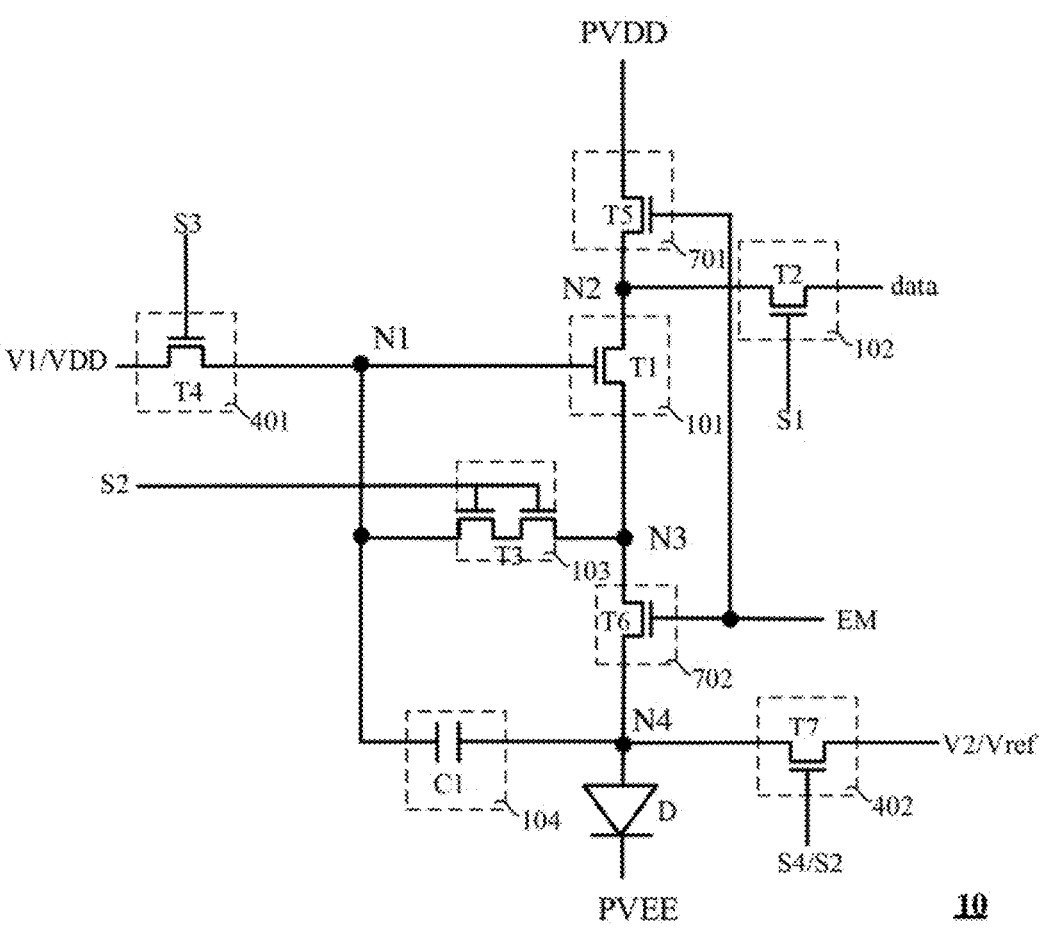
FIG. 7 illustrates another schematic circuit diagram of a pixel driving circuit according to various embodiments of the present disclosure.

FIG. 7 illustrates another schematic circuit diagram of a pixel driving circuit according to various embodiments of the present disclosure. As illustrated in FIG. 7, according to some embodiments of the present disclosure, optionally, the pixel driving circuit 10 may include a 7T1C pixel circuit.

Specifically, the pixel driving circuit 10 may include a driving circuit 101, a data writing circuit 102, a threshold compensation circuit 103, a first storage circuit 104, a first reset circuit 401, a first light emission control circuit 701, a second light emission control circuit 702, and a second reset circuit 402. The driving circuit 101 may include a first transistor T1, the data writing circuit 102 may include a second transistor T2, the threshold compensation circuit 103 may include a third transistor T3, the first reset circuit 401 may include a fourth transistor T4, the first light emission control circuit 701 may include a fifth transistor T5, the second light emission control circuit 702 may include a sixth transistor T6, the second reset circuit 402 may include a seventh transistor T7, and the first storage circuit 104 may include a first storage capacitor C1.

A gate of the first transistor T1 is electrically connected to a first node N1, a first electrode of the first transistor T1 is electrically connected to a second node N2, and a second electrode of the first transistor T1 is electrically connected to a third node N3.

The light-emitting element D is electrically connected to a fourth node N4, and a second electrode of the light-emitting element D is electrically connected to a second power supply voltage signal terminal PVEE. Exemplarily, the second electrode of the light-emitting element D may be a cathode of the light-emitting element D. The second power supply voltage signal terminal PVEE may specifically be a negative voltage signal terminal, that is, a power supply voltage signal that provides a negative voltage value.

A gate of the second transistor T2 is electrically connected to the first scan signal terminal S1, a first electrode of the second transistor T2 is electrically connected to the data signal terminal data, and a second electrode of the second transistor T2 is electrically connected to the second node N2.

A gate of the third transistor T3 is electrically connected to the second scan signal terminal S2, a first electrode of the third transistor T3 is electrically connected to the first node N1, a second electrode of the third transistor T3 is electrically connected to the third node N3. Exemplarily, the third transistor T3 may be a double-gate transistor, and both a first gate and a second gate of the double-gate transistor may be electrically connected to the second scan signal terminal S2.

A gate of the fourth transistor T4 is electrically connected to the third scan signal terminal S3, a first electrode of the fourth transistor T4 is electrically connected to the first initialization signal terminal V1, and a second electrode of the fourth transistor T4 is electrically connected to the first node N1.

A gate of the fifth transistor T5 is electrically connected to a light emission control signal terminal EM, a first electrode of the fifth transistor T5 is electrically connected to a second direct voltage signal terminal PVDD, and a second electrode of the fifth transistor T5 is electrically connected to the second node N2.

A gate of the sixth transistor T6 is electrically connected to the light emission control signal terminal EM, a first electrode of the sixth transistor T6 is electrically connected to the third node N3, and a second electrode of the sixth transistor T6 is electrically connected to the fourth node N4.

A gate of the seventh transistor T7 is electrically connected to the fourth scan signal terminal S4, a first electrode of the seventh transistor T7 is electrically connected to the second initialization signal terminal V2, and a second electrode of the seventh transistor T7 is electrically connected to the fourth node N4.

The first plate of the first storage capacitor C1 is electrically connected to the first node N1, and the second plate of the first storage capacitor C1 is electrically connected to the fourth node N4.

In some embodiments, the second scan signal terminal S2 and the fourth scan signal terminal S4 may be multiplexed.

In some embodiments, a waveform of the scan signal output from the second scan signal terminal S2 and a waveform of the scan signal output from the third scan signal terminal S3 may be the same, and the phase deviation is a preset time interval.

Figure 8:
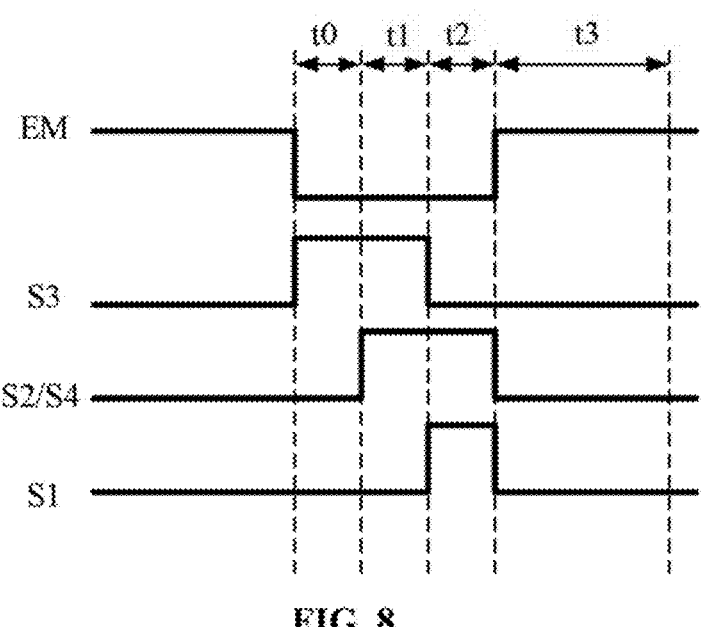
FIG. 8 illustrates a schematic diagram of a driving sequence corresponding to the pixel driving circuit shown in FIG. 7.

FIG. 8 illustrates a schematic diagram of another driving sequence corresponding to the pixel driving circuit illustrated in FIG. 7. With reference to FIG. 7 and FIG. 8, according to some embodiments of the present disclosure, optionally, the driving process of the pixel driving circuit 10 may include a first initialization phase t0, a second initialization phase t1, and a threshold compensation phase t2 and a light emission phase t3. In the first initialization phase t0, the third scan signal terminal S3 outputs a turn-on level, the fourth transistor T4 turns on, and a first initialization signal is transmitted from the first initialization signal terminal V1 to the first node N1. The potential of the node N1 is equal to Vdd, where Vdd represents a voltage value of the first initialization signal.

In the second initialization phase t1, the second scan signal terminal S2, the third scan signal terminal S3 and the fourth scan signal terminal S4 output turn-on levels. The fourth transistor T4 is turned on continuously, and the first initialization signal of the first initialization signal terminal V1 resets the first node N1. At the same time, the third transistor T3 turns on in response to the turn-on level of the second scan signal terminal S2, and the first initialization signal is transmitted to the third node N3 through the turned-on third transistor T3 to reset the third node N3. Both the potential of the first node N1 and the potential of the third node N3 are equal to Vdd. The seventh transistor T7 turns on in response to the turn-on level of the fourth scan signal terminal S4, and the second initialization signal of the second initialization signal terminal V2 is transmitted to the fourth node N4 through the turned-on seventh transistor T7 to reset the fourth node N4. The potential of the fourth node N4 is equal to Vref, where Vref represents a voltage value of the second initialization signal.

In the threshold compensation phase t2, the first scan signal terminal S1, the second scan signal terminal S2 and the fourth scan signal terminal S4 output turn-on levels. The second transistor T2 turns on in response to the turn-on level of the first scan signal terminal S1, and the data signal of the data signal terminal data is written into the second node N2. The first transistor T1 turns on in response to the turn-on level of the first node N1, the third transistor T3 turns on in response to the turn-on level of the second scan signal terminal S2, and the data signal passes through the turned-on first transistor T1 and the turned-on third transistor T3 to be written into the first node N1. At the same time, the threshold voltage of the first transistor T1 is compensated. Both the potential of the first node N1 and the potential of the third node N3 are equal to Vdata+Vth, where Vdata represents a voltage value of the data signal, and Vth represents a threshold voltage of the first transistor T1. The seventh transistor T7 is continuously turned on, the second initialization signal continuously resets the fourth node N4, and the potential of the fourth node N4 is equal to Vref.

In the light emission phase t3, the light emission control signal terminal EM outputs a turn-on level, the fifth transistor T5 and the sixth transistor T6 turn on in response to the turn-on level of the light emission control signal terminal EM, and the first transistor T1 turns on in response to the turn-on level of the first node N1. The potential of the fourth node N4 is raised, and the potential of the fourth node N4 changes from Vref to pvee+Vd, where pvee represents a voltage value of the second power voltage signal output from the second power voltage signal terminal PVEE, and Vd represents a voltage value of the light-emitting element D. The voltage change difference of the potential of the fourth node N4 is Au=pvee+Vd−Vref. Under the coupling action of the first storage capacitor C1, the potential of the first node N1 also changes by Au accordingly. The potential of the first node N1 is Vdata+Vth+Au, that is, Vdata+Vth+pvee+Vd−Vref. The voltage difference between the gate of the first transistor T1 and the second electrode of the first transistor T1 is equal to the voltage difference between the potential of the first node N1 and the potential of the fourth node N4. Specifically, Vgs=Vdata+Vth+pvee+Vd−Vref−(pvee+Vd)=Vdata+Vth−Vref. Correspondingly, the driving current of the pixel driving circuit 10 is $I=K(Vgs-Vth)^2=K(Vdata-Vref)^2$.

It may be seen that the magnitude of the driving current of the pixel driving circuit 10 is not influenced by the threshold voltage Vth of the first transistor T1, thereby ameliorating the Mura phenomenon of the display panel and improving display uniformity.

According to some embodiments of the present disclosure, optionally, the first transistor T1, the second transistor T2, the third transistor T3, the fourth transistor T4, the fifth transistor T5, the sixth transistor T6 and the seventh transistor T7 may be N-type transistors. For N-type transistors, the turn-on level is at a high level, and the cut-off level is at a low level.

Compared with P-type transistors, N-type transistors have a smaller leakage current. Therefore, the stability of the potential of each node can be ensured, thereby ensuring the stability of the display of the display panel, which effectively prevents the flickering phenomenon.

Figure 9:
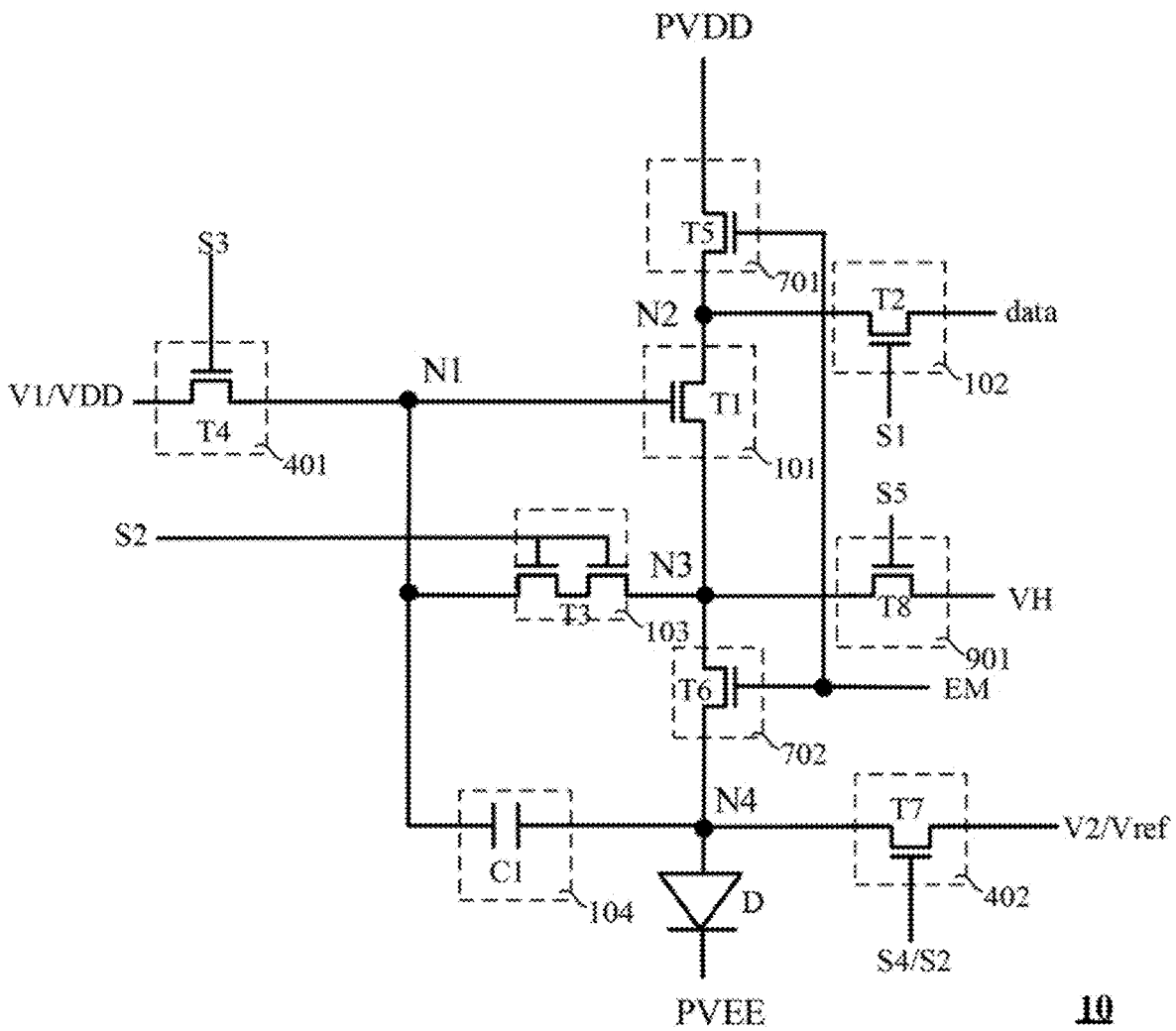
FIG. 9 illustrates another schematic circuit diagram of a pixel driving circuit according to various embodiments of the present disclosure.

FIG. 9 illustrates another schematic circuit diagram of a pixel driving circuit according to various embodiments of the present disclosure. As illustrated in FIG. 9, according to some embodiments of the present disclosure, optionally, the pixel driving circuit 10 may include an 8T1C pixel circuit. Specifically, different from the embodiment shown in FIG. 7, the pixel driving circuit 10 may further include a bias voltage compensation circuit 901. A control terminal of the bias voltage compensation circuit 901 is electrically connected to a fifth scan signal terminal S5, a first terminal of the bias voltage compensation circuit 901 is electrically connected to a bias voltage signal terminal VH, and a second terminal of the bias voltage compensation circuit 901 is electrically connected to the first terminal of the driving circuit 101 or the second terminal of the driving circuit 101.

Before the light emission phase, the bias voltage compensation circuit 901 may be configured to turn on in response to the turn-on level provided by the fifth scan signal terminal S5 and transmit a bias voltage signal of the bias voltage signal terminal VH to the first terminal of the driving circuit 101 or the second terminal of the driving circuit 101. Under the control of the turn-on level of the first node N1, the driving circuit 101 is in a turned-on state. Therefore, whether the bias voltage signal of the bias voltage signal terminal VH is transmitted to the first terminal of the driving circuit 101 or transmitted to the second terminal of the driving circuit 101, in the end, the bias voltage signal may be transmitted to the second terminal of the driving circuit 101. The voltage value of the bias voltage signal is a positive voltage value. Therefore, the potential of the second terminal of the driving circuit 101 may be raised so that the potential of the second terminal of the driving circuit 101 is higher than the potential of the control terminal of the driving circuit 101, thereby adjusting the offset state of the threshold voltage of the driving circuit 101. Accordingly, the brightness of the first frame image after the display panel switches screens may be improved.

Refer continuously to FIG. 9, according to some embodiments of the present disclosure, optionally, the bias voltage compensation circuit 901 may include an eighth transistor T8. A gate of the eighth transistor T8 is electrically connected to the fifth scan signal terminal S5, a first electrode of the eighth transistor T8 is electrically connected to the bias voltage signal terminal VH, and a second electrode of the eighth transistor T8 is electrically connected to the first terminal of the driving circuit 101 or the second terminal of the driving circuit 101. Before the light emission phase, the eighth transistor T8 turns on and transmits the bias voltage signal of the bias voltage signal terminal VH to the first terminal of the driving circuit 101 or the second terminal of the driving circuit 101 to adjust the offset state of the threshold voltage of the driving circuit 101.

It should be noted that the 7T1C pixel circuit and 8T1C pixel circuit mentioned above are merely for exemplary purposes. The pixel driving circuit 10 in the embodiments of the present disclosure includes but is not limited to a 7T1C pixel circuit and an 8T1C pixel circuit, but may also be other types of pixel driving circuits, such as a 7T2C pixel circuit, a 9T1C pixel circuit or a 9T2C pixel circuit, etc.

Based on the pixel driving circuit 10 provided by the embodiments described above, correspondingly, the embodiments of the present disclosure further provide an array substrate.

Before introducing the array substrate, it should be noted that 'signal terminal' and 'signal line' in the embodiments of the present disclosure may be understood as the same concept. For example, a first direct voltage signal terminal may also be called a first direct voltage signal line, or it may also be understood that the potential of a first direct voltage signal terminal is the same as the potential of a first direct voltage signal line, or the two are electrically connected to each other.

Figure 10:
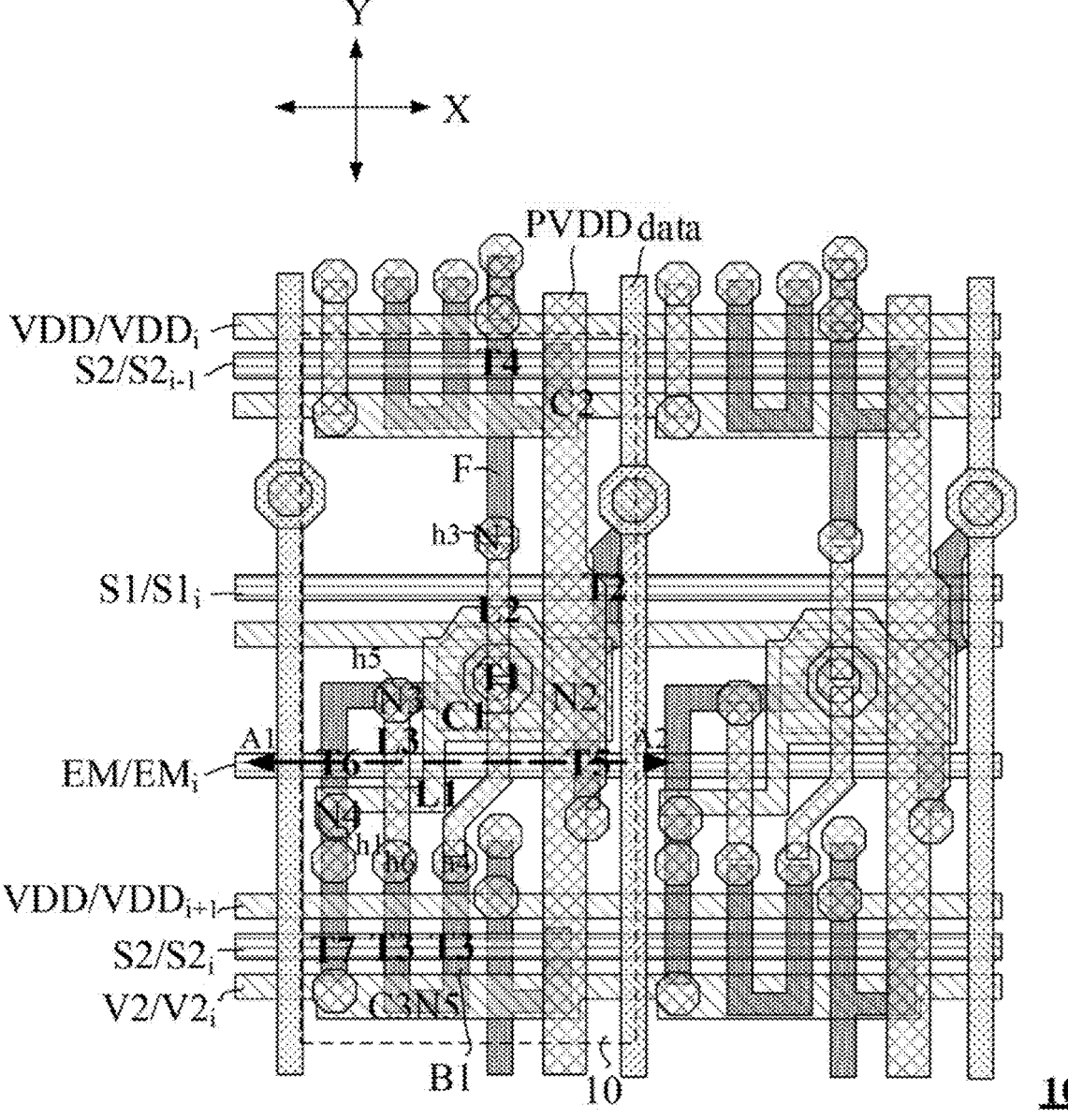
FIG. 10 illustrates a partial layout of an array substrate according to various embodiments of the present disclosure.

FIG. 10 illustrates a partial layout of an array substrate according to various embodiments of the present disclosure. As illustrated in FIG. 10, an array substrate 100 may include a first direct voltage signal line VDD, a second direct voltage signal line PVDD, and a pixel driving circuit 10. The first direct voltage signal line VDD may extend along a first direction X, the second direct voltage signal line PVDD may extend along a second direction Y, and the first direction X intersects the second direction Y. Exemplarily, the first direction X may be the direction of the rows of the array substrate 100, and the second direction Y may be the direction of the columns of the array substrate 100.

In some embodiments, the first direct voltage signal line VDD may extend in the same direction as the second direct voltage signal line PVDD, such as both extending along the first direction X, or both extending along the second direction Y.

In some embodiments, the array substrate 100 may specifically include a plurality of first direct voltage signal lines VDD extending along the first direction X and sequentially arranged along the second direction Y. The array substrate 100 may specifically include a plurality of second direct voltage signal lines PVDD extending along the second direction Y and sequentially arranged along the first direction X. Both the first direct voltage signal lines VDD and the second direct voltage signal lines PVDD may output direct voltage signals with positive voltage values. The voltage values of the direct voltage signals output by the first direct voltage signal lines VDD and the second direct voltage signal lines PVDD may be the same or different, which is not limited by the embodiments of the present disclosure.

A plurality of pixel driving circuits 10 may be arranged in an array along the first direction X and the second direction Y. The pixel driving circuits 10 may be electrically connected to the first direct voltage signal lines VDD and the second direct voltage signal lines PVDD, respectively. The pixel driving circuits 10 may be configured to work under the voltage signals provided by the first direct voltage signal lines VDD and the second direct voltage signal lines PVDD. In some embodiments, different rows of pixel driving circuits 10 may be connected to different first direct voltage signal lines VDD, the same row of pixel driving circuits 10 may be electrically connected to the same first direct voltage signal line VDD, different columns of pixel driving circuits 10 may be connected to different second direct voltage signal lines PVDD, and the same column of pixel driving circuits 10 may be electrically connected to the same second direct voltage signal line PVDD. Apparently, the pixel driving circuits 10 in different rows (such as adjacent rows) may also be electrically connected to the same first direct voltage signal line VDD.

Refer continuously to FIG. 10, a pixel driving circuit 10 may include a first transistor T1 and a first storage capacitor C1. A gate of the first transistor T1 is electrically connected to the first node N1, and the first transistor T1 may be configured to provide a driving current for a light-emitting element. A first plate of the first storage capacitor C1 may be electrically connected to the first node N1, and a second plate of the first storage capacitor C1 may be electrically connected to the first electrode of the light-emitting element through a first connection part L1.

Before the light emission phase, the threshold voltage Vth of the first transistor T1 may be compensated in advance. In the light emission phase, the first storage capacitor C1, through its own coupling, adjusts the potential of the gate of the first transistor T1 in response to the change in potential of the first electrode of the light-emitting element D, so that the change pattern of the potential of the first electrode of the light-emitting element D is consistent with the change pattern of the potential of the gate of the first transistor T1. Since the second electrode of the first transistor T1 is connected to the first electrode of the light-emitting element D in the light emission phase, the adjustment of the first storage capacitor C1 may make the change pattern of the potential of the gate of the first transistor T1 consistent with the change pattern of the potential of the second electrode of the first transistor T1. Therefore, the threshold voltage Vth may be kept within the voltage difference between the potential of the gate of the first transistor T1 and the potential of the second electrode of the first transistor T1, thereby eliminating the influence of the threshold voltage Vth on the driving current of the pixel driving circuit 10. This ameliorates the Mura phenomenon of the display panel and improves display uniformity.

Refer continuously to FIG. 10, according to some embodiments of the present disclosure, optionally, the array substrate 100 may further include a first scan signal line S1, a second scan signal line S2 and a data signal line data. Both the first scan signal line S1 and the second scan signal line S2 may extend along the first direction X, and the data signal line data may extend along the second direction Y. In some embodiments, the array substrate 100 may specifically include a plurality of first scan signal lines S1 extending along the first direction X and sequentially arranged along the second direction Y, a plurality of second scan signal lines S2 extending along the first direction X and sequentially arranged along the second direction Y, and a plurality of data signal lines data extending along the second direction Y and sequentially arranged along the first direction X. A plurality of rows of pixel driving circuits 10 may be electrically connected one-to-one to a plurality of corresponding first scan signal lines S1. A plurality of rows of pixel driving circuits 10 may be electrically connected one-to-one to a plurality of corresponding second scan signal lines S2. A plurality of columns of pixel driving circuits 10 may be electrically connected one-to-one to a plurality of corresponding data signal lines data.

The pixel driving circuit 10 may further include a second transistor T2 and a third transistor T3. A gate of the second transistor T2 is electrically connected to the first scan signal line S1, a first electrode of the second transistor T2 is electrically connected to the data signal line data, and a second electrode of the second transistor T2 is electrically connected to the first electrode of the first transistor T1. A gate of the third transistor T3 is electrically connected to the second scan signal line S2, a first electrode of the third transistor T3 is electrically connected to the first node N1, and a second electrode of the third transistor T3 is electrically connected to the second electrode of the first transistor T1.

In the threshold compensation phase, the second transistor T2 may turn on in response to the turn-on level of the first scan signal line S1, and the data signal of the data signal line data is written into the first electrode of the first transistor T1. The first transistor T1 turns on in response to the turn-on level of the first node N1, the third transistor T3 turns on in response to the turn-on level of the second scan signal line S2. The data signal is written into the first node N1 through the turned-on first transistor T1 and the turned-on third transistor T3 to implement data signal writing and compensation of the threshold voltage of the first transistor T1.

Refer continuously to FIG. 10, according to some embodiments of the present disclosure, optionally, the array substrate 100 may further include a light emission control signal line EM. The light emission control signal line EM may extend along the first direction X. In some embodiments, the array substrate 100 may specifically include a plurality of light emission control signal lines EM extending along the first direction X and sequentially arranged along the second direction Y. A plurality of rows of pixel driving circuits 10 may be electrically connected one-to-one to a plurality of corresponding light emission control signal lines EM.

FIG. 10 schematically illustrates part of the pixel driving circuit 10 of an i-th row pixel driving circuit 10, a corresponding light emission control signal line $EM_i$ connected to the i-th row pixel driving circuit 10, and a corresponding first scan signal line $S1_i$ connected to the i-th row pixel driving circuit 10, where i is a positive integer. Along the second direction Y, the light emission control signal line $EM_i$ may be disposed on a side of the first transistor T1 in the i-th row pixel driving circuit 10 away from the first scan signal line $S1_i$ and disposed between the first transistor T1 and the third transistor T3 in the i-th row pixel driving circuit 10.

The array substrate 100 may further include a second connection part L2 and a third connection part L3. At least part of the wiring in the second connection part L2 extends along the second direction Y, and at least part of the wiring in the third connection part L3 extends along the second direction Y. The first electrode of the third transistor T3 may be electrically connected to the first node N1 through the second connection part L2, and the second electrode of the third transistor T3 may be electrically connected to the second electrode of the first transistor T1 (the third node N3 in FIG. 10) through the third connection part L3.

Along the thickness direction of the array substrate, the second connection part L2 may partially overlap with the light emission control signal line EM, and the third connection part L3 may partially overlap with the light emission control signal line EM.

As can be seen, FIG. 10 schematically illustrates a second scan signal line S2$i$ correspondingly connected to the i-th row pixel driving circuit 10, and a second scan signal line S2$_{i-1}$ correspondingly connected to the (i–1)-th row pixel driving circuit 10, and a first direct voltage signal line VDD$_i$ correspondingly connected to the i-th row pixel driving circuit 10. Along the second direction Y, the second scan signal line S2$i$ is disposed on the side of the light emission control signal line EM$_i$ away from the first transistor T1 in the i-th row pixel driving circuit 10, and the (i–1)-th row second scan signal line S2$_{i-1}$ is disposed on the side of the first scan signal line S1$_i$ away from the first transistor T1 in the i-th row pixel driving circuit 10. A gate of the third transistor T3 may be electrically connected to the second scan signal line S2$_i$. In some examples, the third transistor T3 may be a double-gate transistor, and both a first gate and a second gate of the third transistor T3 in the i-th row pixel driving circuit 10 may be electrically connected to the second scan signal line S2$_i$.

The pixel driving circuit 10 may further include a fourth transistor T4, a gate of the fourth transistor T4 in the i-th row pixel driving circuit 10 is electrically connected to the second scan signal line S2$_{i-1}$, a first electrode of the fourth transistor T4 is electrically connected to the first direct voltage signal line VDD$_i$, and a second electrode of the fourth transistor T4 is electrically connected to the first node N1. For the i-th row pixel driving circuit 10, along the second direction Y, both the fourth transistor T4 and the first node N1 may be disposed on the side of the first transistor T1 away from the light emission control signal line EM$_i$.

The pixel driving circuit 10 may further include a fifth transistor T5 and a sixth transistor T6. A gate of the fifth transistor T5 in the i-th row pixel driving circuit 10 is electrically connected to the light emission control signal line EM$_i$, a first electrode of the fifth transistor T5 in the i-th row pixel driving circuit 10 is electrically connected to the second direct voltage signal line PVDD, and a second electrode of the fifth transistor T5 is electrically connected to the second node N2. A gate of the sixth transistor T6 in the i-th row pixel driving circuit 10 is electrically connected to the light emission control signal line EM$_i$, a first electrode of the sixth transistor T6 is electrically connected to the third node N3, and a second electrode of the sixth transistor T6 is electrically connected to the fourth node N4.

As illustrated in FIG. 10, along the second direction Y, the third transistor T3 in the i-th row pixel driving circuit 10 is disposed on the side of the first transistor T1 in the i-th row pixel driving circuit 10 away from the side of the first scan signal line S1$_i$. In one aspect, this allows the gate of the third transistor T3 to electrically connected to the second scan signal line S2$_i$. In another aspect, this may provide sufficient space to dispose the third transistor, which makes wiring design easier. In addition, since the first node N1 is disposed on the side of the first transistor T1 away from the light emission control signal line EM$_i$, by including the second connection part L2 and the third connection part L3, the third transistor T3 may be able to electrically connected to the first node N1 and the third node N3, thereby allowing the compensation of threshold voltage of the first transistor T1 to be achieved.

Refer continuously to FIG. 10, according to some embodiments of the present disclosure, optionally, the array substrate 100 may further include a second initialization signal line V2. The second initialization signal line V2 may extend along the first direction X. In some embodiments, the array substrate 100 may specifically include a plurality of second initialization signal lines V2 extending along the first direction X and sequentially arranged along the second direction Y. A plurality of rows of pixel driving circuits 10 may be electrically connected one-to-one to a plurality of corresponding second initialization signal lines V2. FIG. 10 schematically illustrates a second initialization signal line V2$i$ correspondingly connected to the i-th row pixel driving circuit 10. Along the second direction Y, the second initialization signal line V2$i$ may be disposed between the light emission control signal line EM$_i$ and the second scan signal line S2$_i$.

The pixel driving circuit 10 may further include a seventh transistor T7, a gate of the seventh transistor T7 in the i-th row pixel driving circuit 10 may be electrically connected to the second scan signal line S2$_1$, the first electrode of the seventh transistor T7 in the i-th row pixel driving circuit 10 may be electrically connected to the second initialization signal line V21, and the second electrode of the seventh transistor T7 the i-th row pixel driving circuit 10 may be electrically connected to the fourth node N4.

Along the second direction Y, a first direct voltage signal line VDD$_{i+1}$ correspondingly connected to the (i+1)-th row pixel driving circuits 10 may be disposed between the light emission control signal line EM$_i$ and the second scan signal line S2$_i$. The second initialization signal line V2$_i$ may be disposed on the side of the second scan signal line S2$_i$ away from the first direct voltage signal line VDD$_{i+1}$.

Along the thickness direction of the array substrate, a first semiconductor part B1 where an active region of the third transistor T3 in the i-th row pixel driving circuit 10 is located may overlap with the second initialization signal line V2$_i$ and/or the first direct voltage signal line VDD$_{i+1}$ to form a second storage capacitor C2.

As mentioned before, the third transistor T3 may be a double-gate transistor, and the node between the first gate and the second gate of the double-gate transistor is the fifth node N5.

Accordingly, by including the second storage capacitor C2, the function of the second storage capacitor C2 in charge storage may be utilized to store a charge of the fifth node N5 in the second storage capacitor C2. Therefore, when a signal on the second scan signal line S2$i$ is switched, the charge of the fifth node N5 may be prevented from being injected into the first node N1, so that the potential of the gate of the first transistor T1 may be kept stable, thereby improving the display uniformity.

Figure 11:
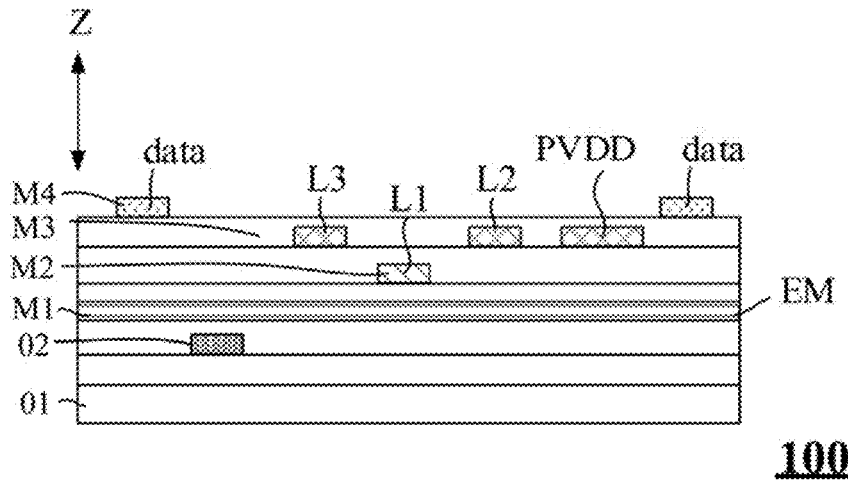
FIG. 11 illustrates a schematic cross-sectional view along the direction A1-A2 in FIG. 10.

FIG. 11 illustrates a schematic cross-sectional view along the direction A1-A2 in FIG. 10. As illustrated in FIG. 11, according to some embodiments of the present disclosure, optionally, along a thickness direction Z of the array substrate, the array substrate 100 may include a substrate 01, a semiconductor layer 02, a first metal layer M1, a second metal layer M2, a third metal layer M3, and insulating layers interposed between adjacent metal layers.

With reference to FIG. 10 and FIG. 11, in some embodiments, the active region of the third transistor T3 may be disposed in the semiconductor layer 02, the light emission control signal line EM may be disposed in the first metal layer M1, the second plate of the first storage capacitor C1 may be disposed in the second metal layer M2, and both the second connection part L2 and the third connection part L3 may be disposed in the third metal layer M3. The first terminal of the second connection part L2 may be electrically connected to the semiconductor layer 02 through a third via hole h3, to allow the electrical connection between the first terminal of the second connection part L2 and the first node N1 to be achieved. The second terminal of the second connection part L2 may be electrically connected to the first electrode (source region or drain region) of the third transistor T3, disposed in the semiconductor layer 02, through a fourth via hole h4. The first terminal of the third connection part L3 may be electrically connected to the second electrode of the first transistor T1, disposed in the semiconductor layer 02, through a fifth via hole h5. The second terminal of the third connection part L3 may be electrically connected to the second electrode of the third transistor T3, disposed in the semiconductor layer 02, through a sixth via hole h6.

It should be noted that, the film layer structure described above is only for illustration, and the array substrate 100 is not limited to the above three metal layers but may also include a greater number of metal layers. For example, as illustrated in FIG. 11, along the thickness direction Z of the array substrate, the array substrate 100 may further include a fourth metal layer M4 disposed on the side of the third metal layer M3 away from the second metal layer M2. The data signal line data may be disposed in the fourth metal layer M4. It should be noted that, the second direct voltage signal line PVDD and the data signal line data may be disposed in a same film layer or may be disposed in different film layers. For example, the second direct voltage signal line PVDD may be disposed in the third metal layer M3 or in the fourth metal layer M4, or in another metal layer, which is not limited by the embodiments of the present disclosure. In addition, the light emission control signal line EM may also be disposed in metal layers other than the first metal layer M1, and the second plate of the first storage capacitor C1 may be disposed in metal layers other than the second metal layer M2. The second connection part L2 and the third connection part L3 may be disposed in other metal layers other than the third metal layer M3, which are not limited by the embodiments of the present disclosure.

Refer continuously to FIG. 10, according to some embodiments of the present disclosure, optionally, the array substrate 100 may further include a first subsection F, and the first subsection F may be electrically connected to the first node N1. The first subsection F may be disposed in the semiconductor layer 02. Specifically, the first subsection F may be a subsection where an active region of the fourth transistor T4 is disposed. Along the thickness direction of the array substrate, the second direct voltage signal line PVDD may overlap with the first subsection F to form a third storage capacitor C3.

In this way, since one of the plates of the third storage capacitor C3 is the second direct voltage signal line PVDD, and the potential of the second direct voltage signal line PVDD is a constant potential that does not easily change, the formed third storage capacitor C3 may better maintain the potential of the first node N1 and ensure the stability of the potential of the first node N1.

Refer continuously to FIG. 10, according to some embodiments of the present disclosure, optionally, the second plate of the first storage capacitor C1 and the first electrode of the light-emitting element may be disposed in different film layers.

The second plate of the first storage capacitor C1 may be electrically connected to the first electrode (not illustrated in the figure) of the light-emitting element through the first connection part L1 and the first via hole h1, and the first connection part L1 and the second plate of the first storage capacitor C1 may be disposed in a same film layer. For example, the first plate of the first storage capacitor C1 may be disposed in the first metal layer M1, the first connection part L1 and the second plate of the first storage capacitor C1 may be disposed in the second metal layer M2.

In this way, the first connection part L1 and the second plate of the first storage capacitor C1 are disposed in the same layer, which can prevent additional punching to configure crosslines, which facilitates saving wiring space.

It should be noted that, in some embodiments, the second plate of the first storage capacitor C1 may also be used as the first electrode of the light-emitting element.

Figure 12:
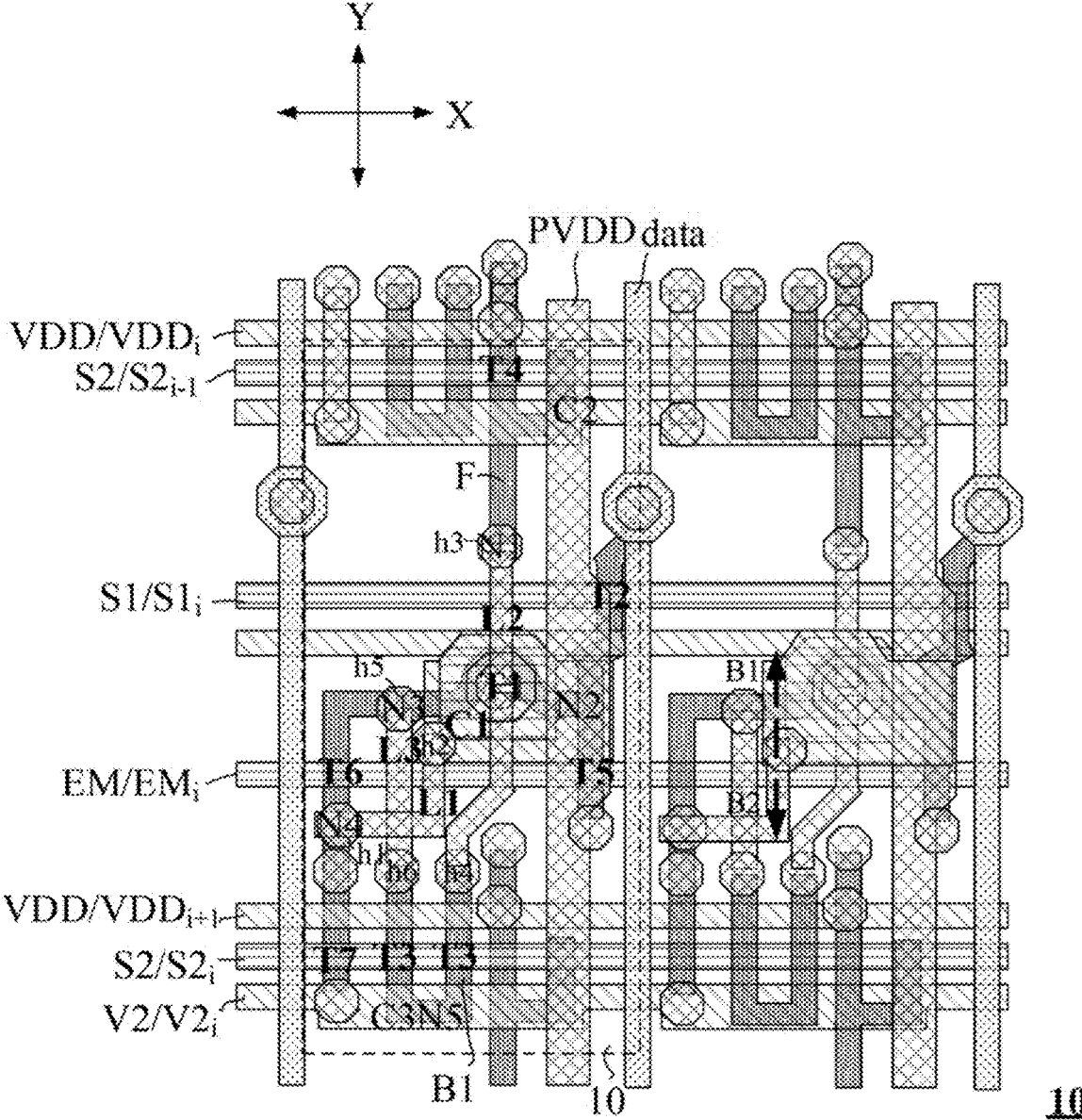
FIG. 12 illustrates another partial layout of an array substrate according to various embodiments of the present disclosure.
Figure 13:
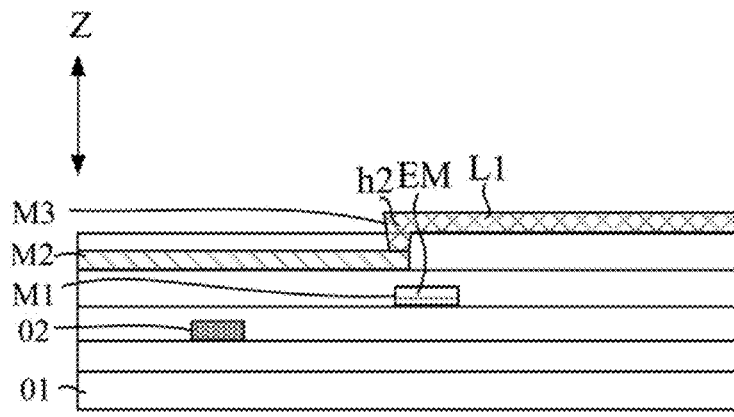
FIG. 13 illustrates a schematic cross-sectional view along the direction B1-B2 in FIG. 12.

FIG. 12 illustrates another partial layout of an array substrate provided by various embodiments of the present disclosure. FIG. 13 illustrates a schematic cross-sectional view along the direction B1-B2 in FIG. 12. With reference to FIG. 12 and FIG. 13, according to some embodiments of the present disclosure, optionally, the first connection part L1 and the second plate of the first storage capacitor C1 may be disposed in different film layers. The second plate of the first storage capacitor C1 may be connected to the first terminal of the first connection part L1 through a second via hole h2, and the second terminal of the first connection part L2 may pass through the first via hole (not illustrated in FIG. 12) to electrically connect to the first electrode of the light-emitting element. Along the thickness direction of the array substrate, the first connection part L1 may partially overlap with the light emission control signal line EM. Furthermore, the film layer where the first connection part L1 is located may be disposed on the side of a film layer where the second plate of the first storage capacitor C1 is located away from a film layer where the light emission control signal line EM is located. That is, along the thickness direction Z of the array substrate, the distance between the first connection part L1 and the light emission control signal line EM is greater than the distance between the second plate of the first storage capacitor C1 and the light emission control signal line EM.

The advantages of such a configuration include: the first connection part L1 may overlap with the light emission control signal line EM to form a coupling capacitance, which may influence the potential of the fourth node N4. By configuring the first connection part L1 on the side of a film layer where the second plate of the first storage capacitor C1 is located away from a film layer where the light emission control signal line EM is located, the distance between the first connection part L1 and the light emission control signal line EM may be increased. Therefore, the coupling capacitance between the first connection part L1 and the light emission control signal line EM is decreased, and thus the influence on the potential of the fourth node N4 is decreased.

Figure 14:
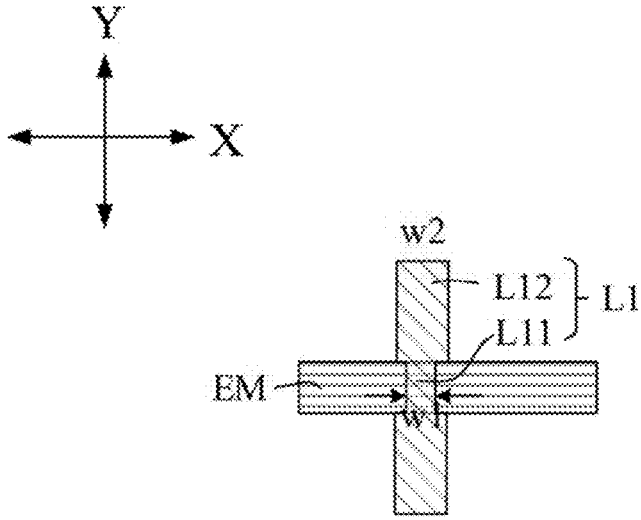
FIG. 14 illustrates a schematic structural diagram of a first connection part and a light emission control signal line in an array substrate according to various embodiments of the present disclosure.

FIG. 14 illustrates a schematic structural diagram of a first connection part and a light emission control signal line in an array substrate provided by various embodiments of the present disclosure. Refer to FIG. 14, according to some embodiments of the present disclosure, optionally, the first connection part L1 may include a first sub-connection part L11 and a second sub-connection part L12. Along the thickness direction of the array substrate, the first sub-connection part L11 may partially overlap with the emission control signal line EM, and the second sub-connection part L12 does not overlap with the emission control signal line EM.

A width w1 of the first sub-connection part L11 may be smaller than a width w2 of the second sub-connection part L12, where w1 is the smallest width of the first sub-connection part along the first direction X and w2 is the smallest width of the second sub-connection part along the first direction X.

In this way, a narrower design is adopted for the overlapping part of the first connection part L1 with the light emission control signal line EM, which further decreases the coupling capacitance between the first connection part L1 and the light emission control signal line EM, and thus decreases the influence on the potential of the fourth node N4.

Figure 15:
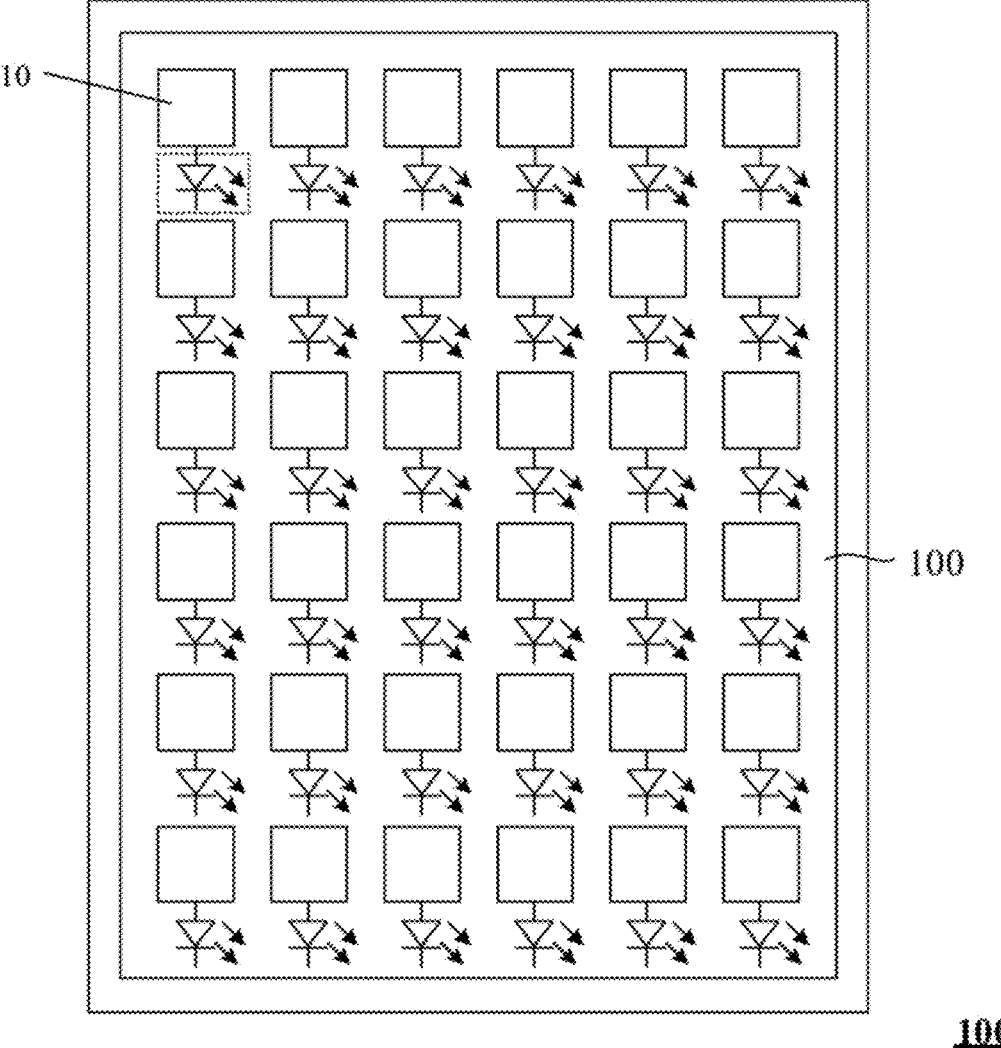
FIG. 15 illustrates a schematic structural diagram of a display device according to various embodiments of the present disclosure.

Based on the pixel driving circuit 10 and the array substrate 100 provided the embodiments described above, correspondingly, the present disclosure also provides a display device, including the pixel driving circuit 10 or the array substrate 100 provided by the present disclosure. Refer to FIG. 15, a schematic structural diagram of a display device provided by various embodiments of the present disclosure is illustrated. The display device 1000 illustrated in FIG. 15 includes a pixel driving circuit 10 or an array substrate 100 provided by any of the embodiments of the present disclosure described above. The illustrated embodiment in FIG. 15 takes a mobile phone as an example to illustrate the display device 1000. It may be understood that the display device provided by the embodiments of the present disclosure may be wearable products, computers, televisions, vehicle-mounted display devices and other devices with display functions. The display device is not specifically limited by this disclosure. The display device provided by the embodiments of the present disclosure has the beneficial effects of the pixel driving circuit 10 or the array substrate 100 provided by the embodiments of the present disclosure. For details, reference may be made to the specific description of the pixel driving circuit 10 or the array substrate 100 described in the above embodiments, detail of which are not described herein again.

In the pixel driving circuits, array substrates and display devices provided in the embodiments of the present disclosure, the first terminal of the first storage circuit is electrically connected to the control terminal of the driving circuit. The second terminal of the first storage circuit is electrically connected to the first electrode of a light-emitting element. In the threshold compensation phase, the data writing circuit turns on in response to a turn-on level provided by the first scan signal terminal, and the threshold compensation circuit turns on in response to a turn-on level provided by the second scan signal terminal to compensate the threshold voltage of the driving circuit. In the light emission phase, the first storage circuit adjusts the potential of the control terminal of the driving circuit in response to a change in potential of the first electrode of the light-emitting element. In the light emission phase, since the second terminal of the driving circuit is connected to the first electrode of the light-emitting element, the adjustment of the first storage circuit may make the change pattern of the potential of the control terminal of the driving circuit consistent with the change pattern of the potential of the second terminal of the driving circuit. The threshold voltage may be kept within the voltage difference between the potential of the control terminal of the driving circuit and the potential of the second terminal of the driving circuit, thereby eliminating the influence of the threshold voltage on the driving current. This ameliorates the Mura phenomenon of the display panel and improves display uniformity.

It should be understood that the specific structures of the circuits and the cross-sectional structures of the array substrates provided by the drawings of the embodiments of the present disclosure are merely for exemplary purposes, but do not limit the present disclosure. In addition, the embodiments provided by the present disclosure described above may be combined with each other if there is no contradiction.

It should be understood that each embodiment in the present disclosure is described in a progressive manner. The same or similar parts of each embodiment may be referred to each other, and each embodiment focuses on explaining its differences from the other embodiments. According to the embodiments of the present disclosure described above, not all details are described, nor is the present disclosure limited to the specific embodiments described. It should be obvious to those skilled in the art that many modifications and variations may be made according to the above description. This description selects and specifically describes these embodiments in order to better explain the principles and practical applications of the present disclosure, so that those skilled in the art may make good use of the present disclosure and modifications based on the present disclosure.

Those skilled in the art should understand that the embodiments described above are illustrative rather than restrictive. Different technical features in different embodiments may be combined to achieve beneficial effects. Those skilled in the art should be able to understand and implement other modified embodiments of the disclosed embodiments of the present disclosure on the basis of understanding the drawings, specification and claims. In the claims, the term "comprises" does not exclude other structures, a quantity that refers to "one" does not exclude a plurality, and the terms "first" and "second" are used to label names and not necessarily to indicate any specific order. Any reference symbols in the claims should not be construed as limiting the scope of the claims. The appearance of certain technical features in different dependent claims does not mean that these technical features cannot be combined to obtain beneficial effects.

What is claimed is:

1. An array substrate, comprising:
a first direct voltage signal line extending along a first direction;
a second direct voltage signal line extending along a second direction, the first direction intersecting the second direction;
a first scan signal line extending along the first direction;
a second scan signal line extending along the first direction;
a data signal line extending along the second direction; and
a plurality of pixel driving circuits, wherein the plurality of pixel driving circuits are arranged in an array along the first direction and the second direction, and the plurality of pixel driving circuits are respectively electrically connected to the first direct voltage signal line and the second direct voltage signal line, wherein
a pixel driving circuit of the plurality of pixel driving circuits comprises:
a first transistor, wherein a gate of the first transistor is electrically connected to a first node, and the first transistor is configured to provide a driving current for a light-emitting element;

a second transistor, wherein a gate of the second transistor is electrically connected to the first scan signal line, a first electrode of the second transistor is electrically connected to the data signal line, and a second electrode of the second transistor is electrically connected to a first electrode of the first transistor;

a third transistor, wherein a gate of the third transistor is electrically connected to the second scan signal line, a first electrode of the third transistor is electrically connected to the first node, and a second electrode of the third transistor is electrically connected to a second electrode of the first transistor; and a first storage capacitor, wherein a first plate of the first storage capacitor is electrically connected to the first node, and a second plate of the first storage capacitor is electrically connected to a first electrode of the light-emitting element through a first connection part.

2. The array substrate according to claim 1, further comprising:

a light emission control signal line extending along the first direction and along the second direction, wherein the light emission control signal line is disposed on a side of the first transistor away from the first scan signal line, and between the first transistor and the third transistor in a corresponding pixel driving circuit;

a second connection part, wherein at least part of a wiring in the second connection part extends along the second direction; and a third connection part, wherein at least part of a wiring in the third connection part extends along the second direction, wherein:

the first electrode of the third transistor is electrically connected to the first node through the second connection part, and the second electrode of the third transistor is electrically connected to the second electrode of the first transistor through the third connection part; and along a thickness direction of the array substrate, the second connection part partially overlaps with the light emission control signal line, and the third connection part partially overlaps with the light emission control signal line.

3. The array substrate according to claim 2, further comprising:

a second initialization signal line extending along the first direction, wherein along the second direction, the first direct voltage signal line is disposed between the light emission control signal line and the second scan signal line, and the second initialization signal line is disposed on a side of the second scan signal line away from the first direct voltage signal line; and along the thickness direction of the array substrate, a first semiconductor part where an active region of the third transistor is located overlaps with the second initialization signal line and/or the first direct voltage signal line, to form a second storage capacitor.

4. The array substrate according to claim 2, wherein:

the array substrate includes a substrate, a semiconductor layer, a first metal layer, a second metal layer, a third metal layer, and insulating layers between adjacent metal layers; and an active region of the third transistor is disposed in the semiconductor layer, the light emission control signal line is disposed in the first metal layer, the second plate of the storage capacitor is disposed in the second metal layer, and the second connection part and the third connection part are disposed in the third metal layer.

5. An array substrate, comprising:

a first direct voltage signal line extending along a first direction;

a second direct voltage signal line extending along a second direction, the first direction intersecting the second direction; and a plurality of pixel driving circuits, wherein the plurality of pixel driving circuits are arranged in an array along the first direction and the second direction, and the plurality of pixel driving circuits are respectively electrically connected to the first direct voltage signal line and the second direct voltage signal line, wherein a pixel driving circuit of the plurality of pixel driving circuits comprises:

a first transistor, wherein a gate of the first transistor is electrically connected to a first node, and the first transistor is configured to provide a driving current for a light-emitting element;

a first storage capacitor, wherein a first plate of the first storage capacitor is electrically connected to the first node, and a second plate of the first storage capacitor is electrically connected to a first electrode of the light-emitting element through a first connection part; and the array substrate further includes a first subsection electrically connected to the first node, wherein along a thickness direction of the array substrate, the second direct voltage signal line overlaps with the first subsection to form a third storage capacitor.

6. The array substrate according to claim 1, wherein:

the second plate of the first storage capacitor and the first electrode of the light-emitting element are disposed in different film layers; and the second plate of the first storage capacitor is electrically connected to the first electrode of the light-emitting element through the first connection part and a first via hole, and the first connection part and the second plate of the first storage capacitor are disposed in a same film layer.

7. The array substrate according to claim 1, further comprising:

a light emission control signal line extending along the first direction and along the second direction, wherein:

the light emission control signal line is disposed on a side of the first transistor away from the first scan signal line, and between the first transistor and the third transistor in a corresponding pixel driving circuit;

the first connection part and the second plate of the first storage capacitor are disposed in different film layers, the second plate of the first storage capacitor is connected to a first terminal of the first connection part through a second via hole, and a second terminal of the first connection part is connected to the first electrode of the light-emitting element through a first via hole; and along a thickness direction of the array substrate, the first connection part partially overlaps the light emission control signal line, and the first connection part is in a film layer disposed on a side of a film layer where the second plate of the first storage capacitor is located away from a film layer where the light emission control signal line is located.

8. The array substrate according to claim 7, wherein:

the first connection part includes a first sub-connection part and a second sub-connection part along the thickness direction of the array substrate, the first sub-connection part overlaps with the light emission control signal line, and the second sub-connection part does not overlap with the light emission control signal line; and a width of the first sub-connection part is smaller than a width of the second sub-connection part, wherein the width of the first sub-connection part is a smallest width of the first sub-connection part along the first direction and the width of the second sub-connection part is a smallest width of the second sub-connection part along the first direction.

9. A display device, comprising:

an array substrate, wherein the array substrate comprises:

a first direct voltage signal line extending along a first direction;

a second direct voltage signal line extending along a second direction, the first direction intersecting the second direction;

a first scan signal line extending along the first direction;

a second scan signal line extending along the first direction;

a data signal line extending along the second direction; and a plurality of pixel driving circuits, wherein the plurality of pixel driving circuits are arranged in an array along the first direction and the second direction, and the plurality of pixel driving circuits are respectively electrically connected to the first direct voltage signal line and the second direct voltage signal line, wherein a pixel driving circuit of the plurality of pixel driving circuits comprises:

a first transistor, wherein a gate of the first transistor is electrically connected to a first node, and the first transistor is configured to provide a driving current for a light-emitting element;

a second transistor, wherein a gate of the second transistor is electrically connected to the first scan signal line, a first electrode of the second transistor is electrically connected to the data signal line, and a second electrode of the second transistor is electrically connected to a first electrode of the first transistor;

a third transistor, wherein a gate of the third transistor is electrically connected to the second scan signal line, a first electrode of the third transistor is electrically connected to the first node, and a second electrode of the third transistor is electrically connected to a second electrode of the first transistor; and a first storage capacitor, wherein a first plate of the first storage capacitor is electrically connected to the first node, and a second plate of the first storage capacitor is electrically connected to a first electrode of the light-emitting element through a first connection part.

\* \* \* \* \*